| United States Patent [19] | [11] Patent Number: 4,880,612 |
|---|---|
| Peters | [45] Date of Patent: Nov. 14, 1989 |

[54] HEXAAMMINEALUMINUM IODIDE MONOAMMONIATE AND PROCESS FOR ITS PREPARATION

[75] Inventor: Dieter Peters, Hürth, Fed. Rep. of Germany

[73] Assignee: Hoechst Aktiengesellschaft, Frankfurt, Fed. Rep. of Germany

[21] Appl. No.: 240,147

[22] Filed: Sep. 2, 1988

[30] Foreign Application Priority Data

Sep. 18, 1987 [DE] Fed. Rep. of Germany ....... 3731454

[51] Int. Cl.$^4$ ............................................. C01B 21/00
[52] U.S. Cl. ........................... 423/413; 156/DIG. 61; 156/DIG. 104
[58] Field of Search ............... 423/413; 156/DIG. 61, 156/DIG. 104

[56] References Cited

FOREIGN PATENT DOCUMENTS 237129  2/1969  U.S.S.R. ............................... 423/413

OTHER PUBLICATIONS

Watt, G. W. et al., J. Amer. Chem. Soc., 78, 5494–5496, (1956).

*Primary Examiner*—John Doll
*Assistant Examiner*—Wayne A. Langel

[57] ABSTRACT

Crystalline hexaamminealuminum iodide monoammoniate is characterized by certain X-ray diffraction lines (CuK$\alpha$) of the 15 strongest lines in order of decreasing intensity. Single crystals of hexaamminealuminum iodide monoammoniate crystallize in the space group Pmn2$_1$ with the lattice constants a=7.600 [Å]
b=13.315 [Å]
c=15.051 [Å]

$\alpha=\beta=\gamma=90°$ and have certain atomic coordinates. Furthermore, processes for the preparation of hexaamminealuminum iodide monoammoniate by reacting aluminum, an iodine compound and ammonia or aluminum iodide and liquid ammonia are described.

13 Claims, No Drawings

HEXAAMMINEALUMINUM IODIDE MONOAMMONIATE AND PROCESS FOR ITS PREPARATION

The present invention relates to hexaamminealuminum iodide monoammoniate in the crystalline state and as single crystals, and processes for its preparation.

Investigations into ammine salts of aluminum iodide are described by G. W. Watt and J. H. Braun in J. Am. Chem. Soc., Vol. 78 (1956), pages 5494–5496. It was found that $AlI_3.20NH_3$ is unstable above $-26°$ C. If $AlI_3.20NH_3$ is heated under reduced pressure, white crystals of $AlI_3.6NH_3$ finally form at 25° C. and $10^{-3}$ bar. The $AlI_3.6NH_3$ can be converted to $AlI_3.5NH_3$ in vacuo.

In this article, it is also reported on page 5494 that aluminum reacts with iodine and ammonia only when mercury is added as a catalyst. Surprisingly, it has now been found that, even in the absence of a catalyst, aluminum can be converted directly into ammine salts of aluminum iodide by iodine compounds in ammonia.

The object of the present invention is to provide a hexaamminealuminum iodide monoammoniate in the crystalline and single-crystal state and in high purity, and a process for its preparation.

It has now been found that crystalline hexaamminealuminum iodide monoammoniate is characterized by the following X-ray diffraction lines (CuKα) of the 15 strongest lines in order of decreasing intensity:

| Line | I/I₀ | 2θ |
|------|------|------|
| 1 | 100 | 21.2 |
| 2 | 34 | 23.4 |
| 3 | 32 | 24.0 |
| 4 | 26 | 27.4 |
| 5 | 25 | 18.9 |
| 6 | 21 | 18.7 |
| 7 | 21 | 30.3 |
| 8 | 20 | 32.6 |
| 9 | 18 | 23.2 |
| 10 | 12 | 26.1 |
| 11 | 11 | 17.8 |
| 12 | 8 | 14.8 |
| 13 | 8 | 14.5 |
| 14 | 8 | 26.8 |
| 15 | 6 | 24.6 | and single crystals of hexaamminealuminum iodide monoammoniate crystallize in the space group $Pmn2_1$ with the lattice constants a = 7.600 [Å]
b = 13.315 [Å]
c = 15.051 [Å]

$\alpha = \beta = \gamma = 90°$ and have the following atomic coordinates (all positions are fully occupied)

| No. | Element | X | Y | Z | Isotropic temperature factor [Å$\alpha$] |
|-----|---------|----------|----------|----------|------|
| 1 | I | 0.000000 | 0.314500 | 0.000000 | 3.130 |
| 2 | I | 0.000000 | 0.638100 | 0.089970 | 2.920 |
| 3 | I | 0.000000 | 0.137200 | 0.680120 | 2.770 |
| 4 | I | 0.000000 | 0.417600 | 0.372200 | 3.820 |
| 5 | I | 0.000000 | 0.922100 | 0.394200 | 4.030 |
| 6 | I | 0.000000 | 0.813800 | 0.769000 | 3.750 |
| 1 | Al | 0.000000 | 0.477300 | 0.731900 | 1.910 |
| 2 | Al | 0.000000 | 0.973900 | 0.034900 | 2.000 |
| 1 | N | 0.000000 | 0.049000 | 0.912000 | 4.500 |
| 2 | N | 0.000000 | 0.547000 | 0.847400 | 1.400 |
| 3 | N | 0.000000 | 0.901000 | 0.153000 | 4.100 |
| 4 | N | 0.000000 | 0.402000 | 0.616500 | 2.500 |
| 5 | N | 0.206000 | 0.069900 | 0.080900 | 3.000 |
| 6 | N | 0.209000 | 0.383000 | 0.779400 | 2.600 |
| 7 | N | 0.326000 | 0.120100 | 0.487300 | 2.000 |
| 8 | N | 0.326000 | 0.431900 | 0.183200 | 2.400 |
| 9 | N | 0.000000 | 0.150000 | 0.259000 | 2.900 |
| 10 | N | 0.000000 | 0.669000 | 0.531000 | 5.200 |

The invention also relates to a process for the preparation of hexaamminealuminum iodide monoammoniate by reacting aluminum, an iodine compound and ammonia, which comprises reacting the reactants without the addition of mercury at between room temperature and 600° C. under ammonia pressures of 8 to 2,000 bar in liquid ammonia and removing the excess ammonia after the end of the reaction at a temperature of 10° to 60° C. by vaporization under atmospheric pressure. In a preferred embodiment, the reaction is carried out between 70° and 200° C., in particular 110° and 130° C., under a pressure of 20 to 200 bar, in paarticular 70 to 110 bar, and the excess ammonia is removed, after the reaction has ended at a temperature of 15° to 30° C. by vaporization under atmospheric pressure.

The iodine compound used is elemental or ammonium iodide in an atomic ratio Al:I = 1:(2–3.1).

In a process variant, when atomic Al is present in excess compared with iodine, the unconverted aluminum is separated from the end product by sieving, or the unconverted aluminum and undissolved impurities are removed from the liquid ammonia phase by filtration or decantation.

It has been found that the reaction rate is increased if chlorine or an inorganic chloride, preferably aluminum chloride or ammonium chloride, is metered into the reactants as a catalyst in an amount of 0.05–10.0, in particular 0.8–1.2, % by weight, based on I used.

In a variant of the process according to the invention for the preparation of hexaamminealuminum iodide monoammoniate, aluminum iodide is reacted with liquid ammonia, and the excess ammonia is then removed at a temperature of 10° to 60° C., in particular 15° to 30° C., by vaporization under atmospheric pressure.

From the lattice constants determined for the single crystal, it was possible to calculate that the X-ray diffraction line no. 1 at 21.2° must consist of two X-ray diffraction lines, one line for $I_1$ at 21.2° with the intensity 100.0 and $I_1'$ at 21.3° with the intensity 94.5. In stating the values I/I₀ in patent claim 1, the sum $I_1 + I_1'$ was used for the value $I_0$ since the X-ray apparatus used only measured $I_0 = I_1 + I_1'$, owing to insufficient resolution.

The products obtained can be incorporated into synthetic resins as flameproofing agents.

The Examples which follow serve to illustrate the invention without restricting it.

EXAMPLE 1

27 parts of aluminum chips and 435 parts of ammonium iodide were initially taken under an inert gas (N₂, Ar) in an enamelled, heatable stirred autoclave. The autoclave was evacuated, after which 561 parts of ammonia were condensed in the autoclave. The autoclave was heated to 75° C. and left at this temperature for 99 hours. The resulting pressure was 35 bar. Thereafter, the autoclave was let down to atmospheric pressure at room temperature. The product gave the following analysis:

$Al_{0.179} I_{0.573} N_{1.289}$ and hence corresponded to the formula $[Al(NH_3)_6]I_3(NH_3)+0.201NH_4I$ The yield was 94%, based on the aluminum.

EXAMPLE 2

27 parts of aluminum chips and 435 parts of ammonium iodide were initially taken under an inert gas ($N_2$, Ar) in the autoclave. The autoclave was evacuated, after which 357 parts of ammonia were condensed in the autoclave and the closed autoclave was heated to 120° C. and left at this temperature for 17 hours. The resulting pressure was 90 bar. The autoclave was let down to atmospheric pressure at 50° C. The product gave the following analysis:

$Al_{0.174} I_{0.580} N_{1.27}$ and hence corresponded to the formula $[Al(NH_3)_6]I_3(NH_3)_{0.97}+0.333NH_4I$ The yield was 90%, based on the aluminum.

EXAMPLE 3

27 parts of aluminum chips and 290 parts of ammonium iodide were initially taken under inert gas ($N_2$, Ar) in the autoclave. After evacuation, 408 parts of ammonia were condensed, and the closed autoclave was heated to 400° C. and kept under 150 bar for 65 hours. The autoclave was let down to atmospheric pressure at 25° C. and the resulting product was separated from the excess aluminum by sieving over a sieve having an internal mesh diameter of 0.20 mm. The conversion was 100%, based on iodine.

The product gave the following analysis:

$Al_{0.196} I_{0.568} N_{1.326}$ and hence corresponded to the following formula $[Al(NH_3)_6]I_3(NH_3)+0.037Al$

EXAMPLE 4

Example 2 was repeated, except that in addition 4 parts of ammonium chloride were introduced into the autoclave and the reaction time was reduced to 8 hours. The product gave the following analysis:

$Al_{0.166} I_{0.576} N_{1.253} Cl_{0.014}$ and hence corresponded to the formula $[Al(NH_3)_6]I_3(NH_3)_{0.99}+0.473NH_4I+0.084NH_4Cl$ The yield was 86%, based on the aluminum.

EXAMPLE 5

Example 3 was repeated, except that now 705 parts of ammonia were condensed in the autoclave. After a reaction time of 65 hours at 400° C., the autoclave was cooled to room temperature and the reaction mixture was removed from the autoclave via a pressure filter. The ammonia in the filtrate was vaporized at room temperature under atmospheric pressure. 524 parts of crystals remained, the crystals giving the following analysis:

$Al_{0.187} I_{0.570} N_{1.318}$

The analytical values hence corresponded to the formula $[Al(NH_3)_6]I_3(NH_3)+0.048NH_4I$ 0.44 part of residue, whih consisted of 97% by weight of aluminum, remained on the pressure filter.

EXAMPLE 6

Commercial $AlI_3$ from Ventron, Karlsruhe, was distilled twice over aluminum from VAW, Bonn. 500 ml of ammonia were condensed at $-40°$ C. onto 100 g of aluminum iodide in the absence of water. The closed autoclave was then heated to 20° C. in the course of 1 hour and let down to atmospheric pressure at this temperature. The product gave the following analysis:

$Al_{0.186} I_{0.565} N_{1.30}$ and hence corresponded to the formula $[Al(NH_3)_6]I_3(NH_3)_{0.95}+0.038NH_4I$

EXAMPLE 7

27 parts of aluminum chips, 392 parts of iodine and 4 parts of aluminum chloride were initially taken in the autoclave. After evacuation, 450 parts of ammonia were condensed, and the closed autoclave was kept under a pressure of 85 bar at 110° C. for 24 hours. The autoclave was then let down to atmospheric pressure at 60° C. The product gave the following analysis:

$Al_{0.182} I_{0.562} N_{1.294} Cl_{0.017}$ and hence corresponded to the formula $[Al(NH_3)_6]I_3(NH_3)_{0.92}+0.083NH_4I+0.093NH_4Cl$ The yield was 97%, based on aluminum.

We claim:

1. A crystalline compound of the formula $[Al(NH_3)_6]I_3(NH_3)_x$ wherein x is about 1.

2. A crystalline hexaamminealuminum iodide monoammoniate which is characterized by the following 15 strongest X-ray diffraction lines (CuKα) in order of decreasing intensity:

| Line | $I/I_0$ | $2\theta$ |
|------|---------|-----------|
| 1 | 100 | 21.2 |
| 2 | 34 | 23.4 |
| 3 | 32 | 24.0 |
| 4 | 26 | 27.4 |
| 5 | 25 | 18.9 |
| 6 | 21 | 18.7 |
| 7 | 21 | 30.3 |
| 8 | 20 | 32.6 |
| 9 | 18 | 23.2 |
| 10 | 12 | 26.1 |
| 11 | 11 | 17.8 |
| 12 | 8 | 14.8 |
| 13 | 8 | 14.5 |
| 14 | 8 | 26.8 |
| 15 | 6 | 24.6 |

3. A single crystal of hexaamminealuminum iodide monoammoniate which crystallizes in the space group $Pmn2_1$ with the lattice constants $a = 7.600$ [Å]
$b = 13.315$ [Å]

c = 15.051 [Å]
α = β = γ = 90° C. and has the following atomic coordinates (all positions are fully occupied):

| No. | Element | X | Y | Z |
|---|---|---|---|---|
| 1 | I | 0.000000 | 0.314500 | 0.000000 |
| 2 | I | 0.000000 | 0.638100 | 0.089970 |
| 3 | I | 0.000000 | 0.137200 | 0.680120 |
| 4 | I | 0.000000 | 0.417600 | 0.372200 |
| 5 | I | 0.000000 | 0.922100 | 0.394200 |
| 6 | I | 0.000000 | 0.813800 | 0.769000 |
| 1 | Al | 0.000000 | 0.477300 | 0.731900 |
| 2 | Al | 0.000000 | 0.973900 | 0.034900 |
| 1 | N | 0.000000 | 0.049000 | 0.912200 |
| 2 | N | 0.000000 | 0.547000 | 0.847400 |
| 3 | N | 0.000000 | 0.901000 | 0.153000 |
| 4 | N | 0.000000 | 0.402000 | 0.616500 |
| 5 | N | 0.206000 | 0.069900 | 0.080900 |
| 6 | N | 0.209000 | 0.383000 | 0.779400 |
| 7 | N | 0.326000 | 0.120100 | 0.487300 |
| 8 | N | 0.326000 | 0.431900 | 0.183200 |
| 9 | N | 0.000000 | 0.150000 | 0.259000 |
| 10 | N | 0.000000 | 0.669000 | 0.531000 |

4. A process for the preparation of hexaamminealuminum iodide monoammoniate by reacting aluminum, an iodine compound and ammonia, which comprises reacting the reactants without the addition of mercury at between room temperature and 600° C. under ammonia pressures of 8 to 2,000 bar in liquid ammonia and removing any excess ammonia after the end of the reaction at a temperature of 10° to 60° C. by vaporization under atmospheric pressure.

5. A process as claimed in claim 4, wherein the reaction is carried out at between 70° and 200° C.

6. A process as claimed in claim 2, wherein the reaction is carried out under an ammonia pressure of 20 to 200 bar.

7. A process as claimed in claim 2, wherein excess ammonia is removed after the end of the reaction at a temperature of 15° to 30° C. by vaporization under atmospheric pressure.

8. A process as claimed in claim 2, wherein the iodine compound used is elemental iodine or ammonium iodide.

9. A process as claimed in claim 2, wherein the atomic ratio Al:I is adjusted to 1:(2–3.1).

10. A process as claimed in claim 2, wherein, when atomic Al is present in excess compared with iodine, the unconverted aluminum is separated from the end product by sieving.

11. A process as claimed in claim 2, wherein, when atomic Al is present in excess compared with iodine, the unconverted aluminum and undissolved impurities are removed from the liquid ammonia phase by filtration or decantation.

12. A process as claimed in claim 2, wherein chlorine or an inorganic chloride in an amount of 0.05 to 10.0% by weight, based on I used, is metered into the reactants as a catalyst.

13. A process as claimed in claim 2, wherein aluminum chloride or ammonium chloride in an amount of 0.05 to 10.0% by weight, based on I used, is metered into the reactants as a catalyst.

* * * * *